United States Patent
Wang et al.

(10) Patent No.: US 12,169,603 B2
(45) Date of Patent: Dec. 17, 2024

(54) ARRAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiao Wang, Beijing (CN); Xiaofeng Yin, Beijing (CN); Weitao Chen, Beijing (CN); Yan Yan, Beijing (CN); Yu Ma, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/758,455

(22) PCT Filed: Sep. 1, 2021

(86) PCT No.: PCT/CN2021/115954
§ 371 (c)(1),
(2) Date: Jul. 6, 2022

(87) PCT Pub. No.: WO2023/028915
PCT Pub. Date: Mar. 9, 2023

(65) Prior Publication Data
US 2024/0176437 A1 May 30, 2024

(51) Int. Cl.
*G06F 3/041* (2006.01)
*G06F 3/044* (2006.01)
(Continued)

(52) U.S. Cl.
CPC ........ *G06F 3/0412* (2013.01); *G06F 3/04164* (2019.05); *G06F 3/0443* (2019.05);
(Continued)

(58) Field of Classification Search
CPC .. G06F 3/0412; G06F 3/04164; G06F 3/0443; G06F 3/0448; G06F 2203/04107;
(Continued)

(56) References Cited

U.S. PATENT DOCUMENTS

| 9,070,334 B2* | 6/2015 | Chen | G09G 3/3648 |
| 2005/0200791 A1* | 9/2005 | Ahn | G02F 1/13439 |
| | | | 349/141 |

(Continued)

FOREIGN PATENT DOCUMENTS

| CN | 104461142 A | 3/2015 |
| CN | 105159520 A | 12/2015 |

(Continued)

OTHER PUBLICATIONS

European Patent Office, Extended European Search Report Issued in Application No. 21955462.3, Mar. 25, 2024, Germany, 7 pages.

*Primary Examiner* — Mihir K Rayan
(74) *Attorney, Agent, or Firm* — McCoy Russell LLP

(57) ABSTRACT

The present disclosure provides an array substrate and a display device. The array substrate includes: a plurality of gate lines extending in a first direction, and a plurality of data lines extending in a second direction and crossing the gate lines to define a plurality of sub-pixels; a plurality of touch signal lines extending in the second direction and arranged in light shielding regions of the sub-pixels; a plurality of touch electrodes insulated from each other; and a plurality of metal pattern units corresponding to the sub-pixels respectively and arranged in the light shielding region of each sub-pixel. The metal pattern unit includes a first metal strip arranged on at least one side of the data line and extending in the second direction.

19 Claims, 6 Drawing Sheets

(51) Int. Cl.
*H01L 23/552* (2006.01)
*H01L 29/786* (2006.01)

(52) U.S. Cl.
CPC .. *G06F 3/0448* (2019.05); *G06F 2203/04107* (2013.01); *G06F 2203/04111* (2013.01); *H01L 23/552* (2013.01); *H01L 29/78633* (2013.01)

(58) Field of Classification Search
CPC ......... G06F 2203/04111; H01L 23/552; H01L 29/78633
See application file for complete search history.

(56) References Cited

U.S. PATENT DOCUMENTS

| | | | | |
|---|---|---|---|---|
| 2014/0184944 A1* | 7/2014 | Ma | ........................ | G06F 3/0412 349/12 |
| 2014/0333849 A1* | 11/2014 | Ma | .................... | G02F 1/134363 349/12 |
| 2017/0023816 A1 | 1/2017 | Maede et al. | | |
| 2017/0115784 A1 | 4/2017 | Li et al. | | |
| 2018/0239485 A1 | 8/2018 | Shi | | |
| 2018/0341355 A1 | 11/2018 | Li et al. | | |
| 2018/0348584 A1 | 12/2018 | Wu | | |
| 2020/0004365 A1 | 1/2020 | Shin et al. | | |
| 2020/0183563 A1 | 6/2020 | Weng et al. | | |
| 2021/0408081 A1 | 12/2021 | Liu et al. | | |

FOREIGN PATENT DOCUMENTS

| | | |
|---|---|---|
| CN | 106020545 A | 10/2016 |
| CN | 106997131 A | 8/2017 |
| CN | 107024813 A | 8/2017 |
| CN | 108598087 A | 9/2018 |
| CN | 109031815 A | 12/2018 |
| CN | 209373316 U | 9/2019 |
| CN | 110658939 A | 1/2020 |
| CN | 111290652 A | 6/2020 |
| CN | 111831173 A | 10/2020 |

\* cited by examiner

ARRAY SUBSTRATE AND DISPLAY DEVICE

CROSS REFERENCE TO RELATED APPLICATION

The present application is a U.S. National Phase of International Application No. PCT/CN2021/115954 entitled "ARRAY SUBSTRATE AND DISPLAY DEVICE," and filed on Sep. 1, 2021. The entire contents of the above-listed application are hereby incorporated by reference for all purposes.

TECHNICAL FIELD

The present disclosure relates to the field of touch display technology, in particular to an array substrate and a display device.

BACKGROUND

With the rapid development of the display technology, touch screens have been widely used. For an In-Cell (built-in) touch screen, a touch electrode unit is built in a Liquid Crystal Display (LCD) screen to reduce a thickness of a module as well as the manufacture cost, so the In-Cell touch screen has attracted more and more attentions and becomes a new development trend in the future due to such advantages as high integration level, being light and thin, low manufacture cost, low power consumption, high image quality, and being capable of achieve a multi-touch function.

SUMMARY

An object of the present disclosure is to provide an array substrate and a display device, so as to improve the yield as well as the quality of display products.

The present disclosure provides the following technical solutions.

In one aspect, the present disclosure provides in some embodiments an array substrate, including: a base substrate, and a plurality of gate lines extending in a first direction and a plurality of data lines extending in a second direction arranged on the base substrate. Each gate line crosses the plurality of data lines to define a plurality of sub-pixels. The array substrate further includes: a plurality of touch signal lines extending in the second direction and arranged in light shielding regions of the sub-pixels; a plurality of touch electrodes insulated from each other and each coupled to at least one touch signal line; and a plurality of metal pattern units corresponding to the sub-pixels respectively and each arranged in the light shielding region of the corresponding sub-pixel. The metal pattern unit includes a first metal strip arranged on at least one side of the data line and extending in the second direction, an overlapping area between an orthogonal projection of the first metal strip onto the base substrate and an orthogonal projection of the touch signal line onto the base substrate is A, and a ratio of the overlapping area A to an area of the orthogonal projection of the touch signal line onto the base substrate is greater than a threshold.

In a possible embodiment of the present disclosure, in a direction parallel to the base substrate and perpendicular to the second direction, a size of the touch signal line is less than a size of the first metal strip.

In a possible embodiment of the present disclosure, in the direction parallel to the base substrate and perpendicular to the second direction, a boundary of the orthogonal projection of the first metal strip onto the base substrate exceeds a boundary of the orthogonal projection of the touch signal line onto the base substrate by 0.8 μm to 2.0 μm.

In a possible embodiment of the present disclosure, the touch signal line is provided with a center line extending in the second direction, the first metal strip is provided with a center line extending in the second direction, and an orthogonal projection of the center line of the touch signal line onto the base substrate coincides with an orthogonal projection of the center line of the first metal strip onto the base substrate.

In a possible embodiment of the present disclosure, the orthogonal projection of the first metal strip onto the base substrate does not overlap an orthogonal projection of the data line onto the base substrate.

In a possible embodiment of the present disclosure, in a direction parallel to the base substrate and perpendicular to the second direction, a minimum distance between a boundary of the orthogonal projection of the first metal strip onto the base substrate and a boundary of the orthogonal projection of the data line onto the base substrate is 2.1 μm to 8 μm.

In a possible embodiment of the present disclosure, the metal pattern unit further includes a second metal strip, and the second metal strip includes: a first metal sub-line arranged on at least one side of the gate line and extending in the first direction, and a second metal sub-line arranged on at least one side of the data line and extending in the second direction. The first metal sub-line is coupled to the second metal sub-line, and the second metal sub-line and the first metal strip are arranged at two opposite sides of the sub-pixel respectively.

In a possible embodiment of the present disclosure, the first metal strip is arranged at a same layer as the second metal strip, a first notch is formed between the first metal strip and the second metal strip of a same metal pattern unit in the second direction, and a second notch is formed between two first metal sub-lines of different metal pattern units in the first direction.

In a possible embodiment of the present disclosure, each touch electrode includes a plurality of touch sub-electrodes, and an orthogonal projection of the touch sub-electrode onto the base substrate does not overlap an orthogonal projection of the gate line onto the base substrate and an orthogonal projection of the data line onto the base substrate. In a same touch electrode, the first metal sub-lines in the plurality of metal pattern units are coupled to each other through a first bridging portion arranged at a same layer as or a different layer from the first metal strip at the second notch, and at least one metal pattern unit is coupled to at least one touch sub-electrode in the touch electrode. In different touch electrodes, the first metal sub-lines between the plurality of metal pattern units are not coupled to each other at the second notch. In the same touch electrode, the first metal strip and the second metal strip in each of the metal pattern units in at least one column in the second direction are coupled to each other through a second bridging portion arranged at a same layer as or a different layer from the first metal strip at the first notch, and the first metal strip is coupled to a corresponding touch signal line. The metal pattern units are not coupled to each other between the adjacent touch electrodes in the second direction.

In a possible embodiment of the present disclosure, in the same touch electrode, each first metal strip in the first metal strips in at least one column in the second direction is coupled to the corresponding touch signal line, and all first metal strips corresponding to the touch electrode are not coupled to the touch signal lines not corresponding to the touch electrode so that the metal pattern units are not coupled to each other between the adjacent touch electrodes in the second direction; or in the same touch electrode, the first metal strips in at least two columns in the second direction are coupled to different touch signal lines, and the first metal strip coupled to the touch signal line not corresponding to the touch electrode is not coupled to the second metal strip in the touch electrode at the first notch so that the metal pattern units are not coupled to each other between the adjacent touch electrodes in the second direction.

In a possible embodiment of the present disclosure, each touch electrode includes a plurality of touch sub-electrodes, and an orthogonal projection of the touch sub-electrode onto the base substrate does not overlap an orthogonal projection of the gate line onto the base substrate and an orthogonal projection of the data line onto the base substrate. In a same touch electrode, the first metal sub-lines in the plurality of metal pattern units are coupled to each other through a first bridging portion arranged at a same layer as or a different layer from the first metal strip at the second notch, and at least one metal pattern unit is coupled to at least one touch sub-electrode in the touch electrode. In the same touch electrode, the first metal strip and the second metal strip in each of the metal pattern units in at least one column in the second direction are coupled to each other through a second bridging portion arranged at a same layer as or a different layer from the first metal strip at the first notch, and the first metal strip and the second metal strip in at least one column in the second direction are not coupled to each other at the first notch. In the same touch electrode, the metal pattern units in at least two columns in the second direction are coupled to different touch signal lines, and different touch electrodes are not coupled to each other through the first notch.

In a possible embodiment of the present disclosure, in two adjacent metal pattern units in the first direction, the first metal strip in one metal pattern unit and the second metal sub-line in the other metal pattern unit are arranged at two opposite sides of a same data line, and in a direction parallel to the base substrate and perpendicular to the second direction, a distance between a boundary of an orthogonal projection of the first metal strip onto the base substrate and a boundary of the orthogonal projection of the data line onto the base substrate is the same as a distance between a boundary of an orthogonal projection of the second metal sub-line onto the base substrate and the boundary of the orthogonal projection of the data line onto the base substrate.

In a possible embodiment of the present disclosure, the array substrate further includes a pixel electrode and a common electrode arranged in each sub-pixel, and the touch sub-electrode serves as the common electrode.

In a possible embodiment of the present disclosure, in the direction parallel to the base substrate and perpendicular to the second direction, a distance between a boundary of the orthogonal projection of the data line onto the base substrate and a boundary of an orthogonal projection of the pixel electrode in one sub-pixel adjacent to the data line onto the base substrate is the same as a distance between the boundary of the orthogonal projection of the data line onto the base substrate and a boundary of an orthogonal projection the pixel electrode in the other sub-pixel adjacent to the data line onto the base substrate, and a distance between the boundary of the orthogonal projection of the data line onto the base substrate and a boundary of an orthogonal projection of the common electrode in one sub-pixel adjacent to the data line onto the base substrate is the same as a distance between the boundary of the orthogonal projection of the data line onto the base substrate and a boundary of an orthogonal projection the common electrode in the other sub-pixel adjacent to the data line onto the base substrate.

In a possible embodiment of the present disclosure, the array substrate further includes an organic insulation layer, the touch signal line is arranged at a same layer and made of a same material as the data line, and the organic insulation layer is arrange between a layer where the data line is located and a layer where the touch electrode is located.

In a possible embodiment of the present disclosure, the array substrate further includes a gate insulation layer and a passivation layer, a layer where the metal pattern unit is located, the gate insulation layer, a layer where the touch signal line and the data line are located, the organic insulation layer, the layer where the touch electrode is located, the passivation layer and a layer where the pixel electrode is located are laminated one on another in a direction away from the base substrate, the touch electrode is coupled to the second metal strip through a first connection hole, and the first connection hole at least penetrates through the passivation layer, the organic insulation layer and the gate insulation layer, the touch signal line is coupled to the first metal strip through a second connection hole, and the second connection hole at least penetrates through the passivation layer, the organic insulation layer and the gate insulation layer.

In a possible embodiment of the present disclosure, the first connection hole includes a first sub-hole and a second sub-hole, the first sub-hole penetrates through the passivation layer to expose a part of the touch electrode, the second sub-hole penetrates through the organic insulation layer and the gate insulation layer to exposes a part of the second metal strip, the array substrate further includes a first connection pattern, and an orthogonal projection of the first connection pattern onto the base substrate covers an orthogonal projection of the first sub-hole onto the base substrate and an orthogonal projection of the second sub-hole onto the base substrate to enable the touch electrode to be coupled to the second metal strip.

In a possible embodiment of the present disclosure, the first connection pattern is arranged at a same layer and made of a same material as the pixel electrode.

In a possible embodiment of the present disclosure, the second connection hole includes a third sub-hole and a fourth sub-hole, the third sub-hole penetrates through the passivation layer to expose a part of the touch signal line, the fourth sub-hole penetrates through the organic insulation layer and the gate insulation layer to expose a part of the first metal strip, the array substrate further includes a second connection pattern, and an orthogonal projection of the second connection pattern onto the base substrate covers an orthogonal projection of the third sub-hole of the second connection hole onto the base substrate and an orthogonal projection of the fourth sub-hole of the second connection hole onto the base substrate to enable the touch signal line to be coupled to the first metal strip.

In a possible embodiment of the present disclosure, the array substrate further includes a driving circuitry, at least a part of an output electrode of the driving circuitry is arranged at a side of the organic insulation layer close to the base substrate, the pixel electrode is coupled to the output electrode through a third connection hole, and the third connection hole at least penetrates through the organic insulation layer and the passivation layer to expose the output electrode of the driving circuitry and enable the pixel electrode to be coupled to the output electrode.

In a possible embodiment of the present disclosure, the driving circuitry includes a driving transistor, the third connection hole includes a fifth sub-hole and a sixth sub-hole, the fifth sub-hole penetrates through the organic insulation layer, the sixth sub-hole penetrates through the passivation layer, an orthogonal projection of the fifth sub-hole onto the base substrate covers an orthogonal projection of the sixth sub-hole onto the base substrate, and the pixel electrode is coupled to the output electrode through the third connection hole.

In a possible embodiment of the present disclosure, each pixel electrode includes a plurality of slits extending in the second direction.

In another aspect, the present disclosure provides in some embodiments a display device, including the above-mentioned array substrate, a counter substrate arranged opposite to the array substrate, and a liquid crystal layer arranged between the array substrate and the counter substrate.

In a possible embodiment of the present disclosure, a black matrix is arranged on the counter substrate, an orthogonal projection of the black matrix onto the array substrate is within the light shielding region of the sub-pixel, in the direction parallel to the base substrate and perpendicular to the second direction, a distance between a boundary of an orthogonal projection of the black matrix onto the base substrate and the boundary of the orthogonal projection of the pixel electrode in one sub-pixel adjacent to the black matrix onto the base substrate is the same as a distance between the boundary of the orthogonal projection of the black matrix onto the base substrate and a boundary of the orthogonal projection the pixel electrode in the other sub-pixel adjacent to the black matrix onto the base substrate, and a distance between the boundary of the orthogonal projection of the black matrix onto the base substrate and the boundary of the orthogonal projection of the common electrode in one sub-pixel adjacent to the data line onto the base substrate is the same as a distance between the boundary of the orthogonal projection of the black matrix onto the base substrate and a boundary of an orthogonal projection the common electrode in the other sub-pixel adjacent to the black matrix onto the base substrate.

The present disclosure has the following beneficial effects.

According to the array substrate and the display device in the embodiments of the present disclosure, the touch signal line and the data line are arranged in parallel and the touch signal line is arranged in the light shielding region between adjacent sub-pixels. As a result, the touch signal line and the data line are covered by the black matrix on the counter substrate, so it is able to solve the problem in the related art where a non-uniform electric field is generated between the touch signal line and each of a left electrode and a right electrode when the touch signal line is arranged in the middle of the sub-pixel, thereby to prevent the occurrence of contaminants. In addition, the touch signal line is covered by at least a part of the metal pattern unit and the metal pattern unit further functions as to shield light, so it is able to reduce the dependence on the light shielding effect of the black matrix, thereby to reduce a light shielding area of the black matrix pattern on the counter substrate.

DETAILED DESCRIPTION

Figure 1:
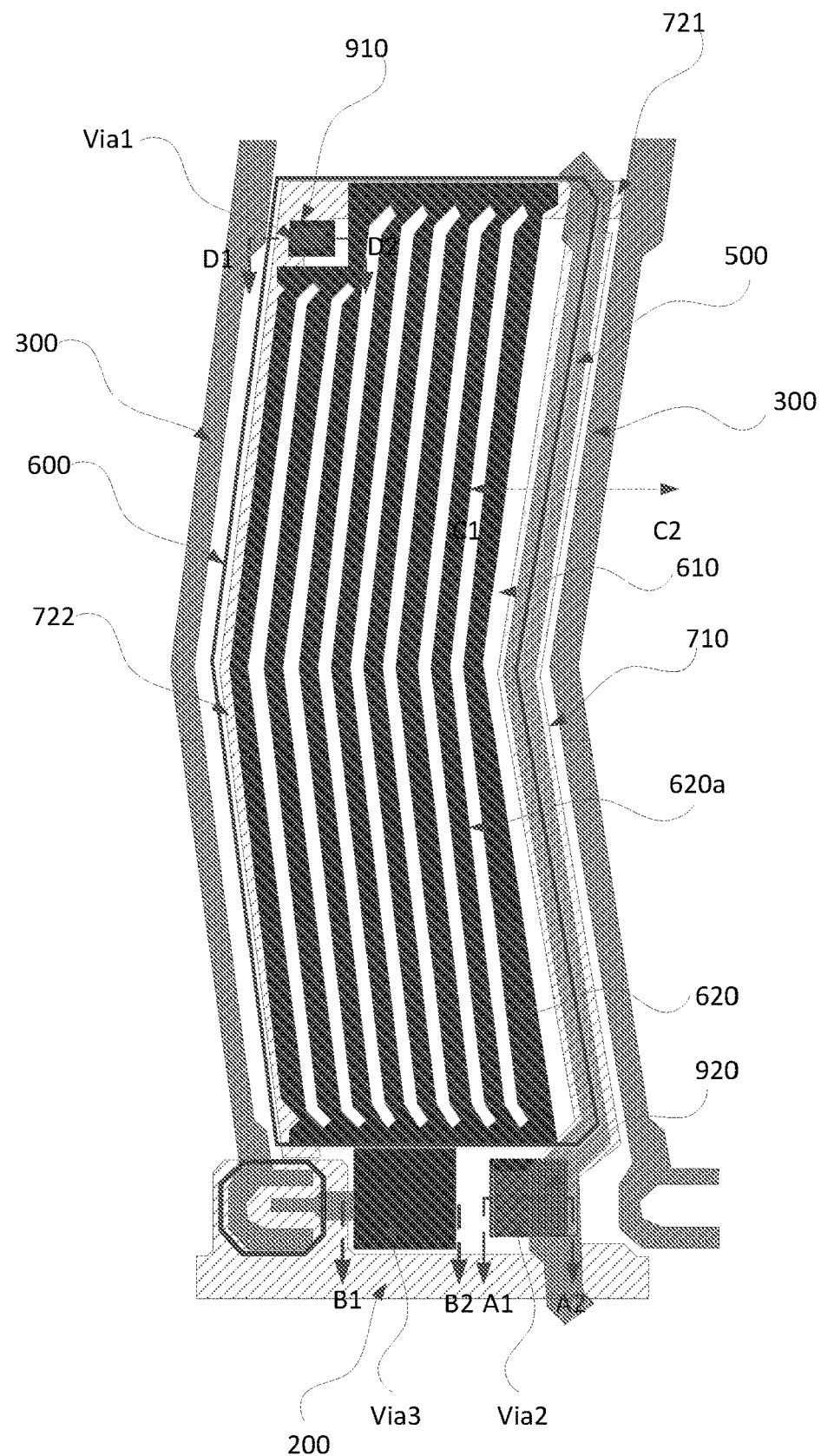
FIG. 1 is a schematic view showing the arrangement of sub-pixels in an array substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the embodiments of the present disclosure, two structures "arranged at a same layer" refers to that the two structures are formed on a same material layer so that they are in a same layer, but it does not mean that a distance between each of them and a substrate is equal, nor that they are completely the same as the other layer structures on the substrate.

In the embodiments of the present disclosure, "patterning process" refers to steps of forming a structure with a specific pattern, which may be a photolithography process including one or more steps of forming a material layer, coating a photoresist, exposing, developing, etching, or removing the photoresist. Of course, the "patterning process" may further be an imprinting process, an inkjet printing process, or any other processes.

The present disclosure will be described hereinafter in a clear and complete manner in conjunction with the drawings. In the drawings, same elements are identified with same reference numerals. For the sake of clarity, various parts in the drawings are not drawn to scale. In addition, some well-known parts may not be shown in the drawings.

Many specific details of the present disclosure, such as structure, material, size, treatment processes, and technique of components, will be described hereinafter in order to better illustrate the present disclosure. However, for a person skilled in the art, the present disclosure may not be implemented in accordance with these specific details.

Prior to describing the array substrate and the display device in the embodiments of the present disclosure in details, some descriptions about the related art will be given hereinafter at first.

In the related art, each liquid crystal pixel on a liquid crystal display is driven by TFTs integrated therein. Based on an operation principle of a touch screen and a medium for transmitting information, the touch screen may be divided into four types: a resistive type, a capacitive type, an infrared type and a surface acoustic wave type. The resistive-type touch screen and the capacitive-type touch screen are widely used, and a projected capacitive type touch screen is most widely used to achieve a multi-touch function, but these touch screens have such disadvantages as high manufacture cost and being thick. Low manufacture cost, lightweight and thinness have become a new trend in the field of touch technology.

In order to provide a thin and light touch panel, the integration of a touch panel and a liquid crystal display (LCD) panel becomes more and more popular. An In-Cell touch scheme, in which the touch panel is built into the LCD panel, has attracted more and more attentions.

The In-Cell touch technology include three types, i.e., a resistive type, a capacitive type and an optical type. The capacitive mode includes self-capacitive touch and mutual-capacitive touch. In the self-capacitive touch mode, a transparent conductive layer as a common electrode (Vcom) on an array substrate is divided into a plurality of blocks which serve as touch electrodes. One end of a touch signal (Tx) line is coupled to the touch electrode through a via hole, and the other end of the Tx line is coupled to a driving integrated circuit (IC). When a finger touches the array substrate, a capacitance value of the touch electrode at a corresponding touch position changes, and the driving IC determines the touch position through detecting the change in the capacitance value, so as to achieve a touch function.

Pixels of a Full In-Cell (FIC) capacitive touch screen adopts a design of Tx In Dot, i.e., the Tx line is arranged in the middle of each sub-pixel, but it has the following problems. A pixel electrode in each sub-pixel includes a plurality of pixel grating bars, and there is a slit between adjacent pixel grating bars. The Tx line is arranged in the middle of the pixel electrode slit and is not shielded by a black matrix (BM) on a color film substrate. If pixel grating bar patterns on a left side and a right side of the Tx line change suddenly, a distance between the Tx line and the pixel grating bar pattern on the left side of the Tx line is not the same as a distance between the Tx line and the pixel grating bar pattern on the right side of the Tx line. At this time, non-uniform electric fields are generated on the left side and right side of the Tx line, and thereby contaminants occur.

An object of the present disclosure is to provide an array substrate and a display device, so as to improve the yield as well as the quality of the display products.

According to the array substrate in the embodiments of the present disclosure, touch electrodes and touch signal lines are integrated inside the array substrate, so as to provide a liquid crystal touch display panel with a Full In-Cell Touch structure. For the liquid crystal touch display panel with the Full In-Cell Touch structure, a touch function and a display function are combined, so it is able to achieve the one-stop manufacture, and provide the array substrate with such advantages as high integration level, being thin and light, low manufacture cost, low power consumption, high image quality and being capable of achieve a multi-touch function.

As shown in FIG. 1 to FIG. 9, the present disclosure provides in some embodiments an array substrate.

The array substrate in the embodiments of the present disclosure includes a base substrate 100, and a plurality of gate lines 200 extending in a first direction and a plurality of data lines 300 extending in a second direction arranged on the base substrate 100. Each gate line 200 crosses the plurality of data lines 300 to define a plurality of sub-pixels 400. The array substrate further includes: a plurality of touch signal (Tx) lines 500 extending in the second direction and arranged in light shielding regions of the sub-pixels 400; a plurality of touch electrodes 600 insulated from each other and each coupled to at least one touch signal line; and a plurality of metal pattern units corresponding to the sub-pixels respectively and each arranged in the light shielding region of the corresponding sub-pixel. The metal pattern unit includes a first metal strip arranged on at least one side of the data line and extending in the second direction, an overlapping area between an orthogonal projection of the first metal strip onto the base substrate and an orthogonal projection of the touch signal line onto the base substrate is A, and a ratio of the overlapping area A to an area of the orthogonal projection of the touch signal line onto the base substrate is greater than a threshold.

In the embodiments of the present disclosure, the first direction includes a horizontal direction, and the second direction includes a vertical direction.

In the embodiments of the present disclosure, at least a part of the first metal strips are coupled to the touch signal lines.

It should be appreciated that, when the first metal strip is coupled to the touch signal line, a part of the first metal strip overlaps a part of the touch signal line, and the first metal strip is lapped onto the touch signal line through a via hole. An overlapping area between an orthogonal projection of the first metal strip onto the base substrate and an orthogonal projection of the touch signal line onto the base substrate is B at a position where the first metal strip is coupled to the touch signal line, and the threshold is just a ratio of the overlapping area B to an area of the orthogonal projection of the metal strip onto the base substrate, e.g., 5%-10%, 10%-20%, or 30%-60%. In this regard, in the embodiments of the present disclosure, the overlapping area A between the orthogonal projection of the first metal strip onto the base substrate and the orthogonal projection of the touch signal line onto the base substrate is greater than the threshold, i.e., the first metal strip overlaps the touch signal line not only at the coupling position but also in other regions.

In the embodiments of the present disclosure, the touch signal line 500 is coupled to a corresponding touch electrode 600 in the array substrate and a chip subsequently bonded onto the array substrate. When the array substrate is arranged opposite to a counter substrate to form an LCD panel and a touch operation is made in a touch region of the LCD panel, a touch signal formed on the touch electrode 600 in the array substrate is changed by the touch operation, the touch signal line 500 is used to transmit the touch signal collected on a touch unit to the chip, and the chip determines a specific touch position in accordance with the touch signal received from the touch signal line 500.

According to the array substrate in the embodiments of the present disclosure, an aperture region corresponding to the sub-pixel 400 is an actual light transmitting region of the sub-pixel 400, and a non-aperture region corresponding to the sub-pixel 400 is a light shielding region corresponding to the sub-pixel 400. For the LCD panels with a same size, the larger the area of the aperture region, the larger the aperture ratio of the LCD panel, and the better the display quality of the LCD panel. The non-aperture region surrounds the aperture region.

In a possible embodiment of the present disclosure, an aperture region corresponding to the sub-pixel 400 is an actual light transmitting region of the sub-pixel 400, and a non-aperture region corresponding to the sub-pixel 400 is a light shielding region corresponding to the sub-pixel 400. In LCD panels with a same size, the larger the area of the aperture region is, the higher the aperture ratio of the LCD panel is, and the better the display quality of the LCD panel is, and the light shielding region surrounds the light transmitting region.

For example, a driving circuitry corresponding to the sub-pixel 400 is arranged in the light shielding region corresponding to the sub-pixel 400, and the gate line 200 and the data line 300 are also arranged in the light shielding region. During the arrangement, the touch signal line 500 is arranged to be parallel and adjacent to the data line 300, and the touch signal line 500 and the data line 300 are both arranged in the light shielding region of the sub-pixel 400. In this way, it is able to shield the touch line 500 and the data line 300 at the same time through a black matrix on the counter substrate, and prevent the occurrence of non-uniform electric fields on the left side and right side of the touch signal line 500 when the touch signal line 500 is arranged at an overlapping position of the pixel electrodes, thereby to prevent the occurrence of contaminants.

In some embodiments of the present disclosure, the touch electrode 600 also serves as a common electrode (Vcom), and correspondingly, the touch signal line 500 also serves as a common electrode line. Based on this, at a touch stage, the touch signal line 500 provides a touch driving signal to the touch electrode 600 and receives a touch feedback signal, and at a display stage, the touch signal line 500 provides a Vcom signal (i.e., a signal required by the common electrode during the display) to the touch electrode 600. When the touch electrode 600 serves as the common electrode and the touch signal line 500 serves as the common electrode line, it is able to reduce a thickness of the array substrate, thereby to reduce a thickness of a touch display panel when the array substrate is applied to the touch display panel.

In some embodiments of the present disclosure, the plurality of metal pattern units 700 is arranged on the array substrate, so the touch electrode 600 is further electrically coupled to the metal pattern unit 700 (i.e., a resistor is coupled in parallel to the touch electrode 600), so as to reduce a resistance of the touch electrode 600 and a load of the touch signal line 500, thereby to facilitate a touch response. In addition, when the touch electrode 600 serves as the common electrode, it is able to reduce a resistance of the common electrode.

In addition, when the overlapping area between the orthogonal projection of the first metal strip onto the base substrate and the orthogonal projection of the touch signal line onto the base substrate is A and the ratio of the overlapping area A to the area of the orthogonal projection of the touch signal line onto the base substrate is greater than the threshold, the first metal strip 710 further functions as to shield light. In this way, it is able to reduce the dependence on a light shielding effect of the black matrix to some extent, and effectively reduce an area of the black matrix pattern on the counter substrate, thereby to increase an aperture ratio.

In the embodiments of the present disclosure, a material of the base substrate 100 may be selected according to the practical need, e.g., but not limited to, glass.

Figure 2:
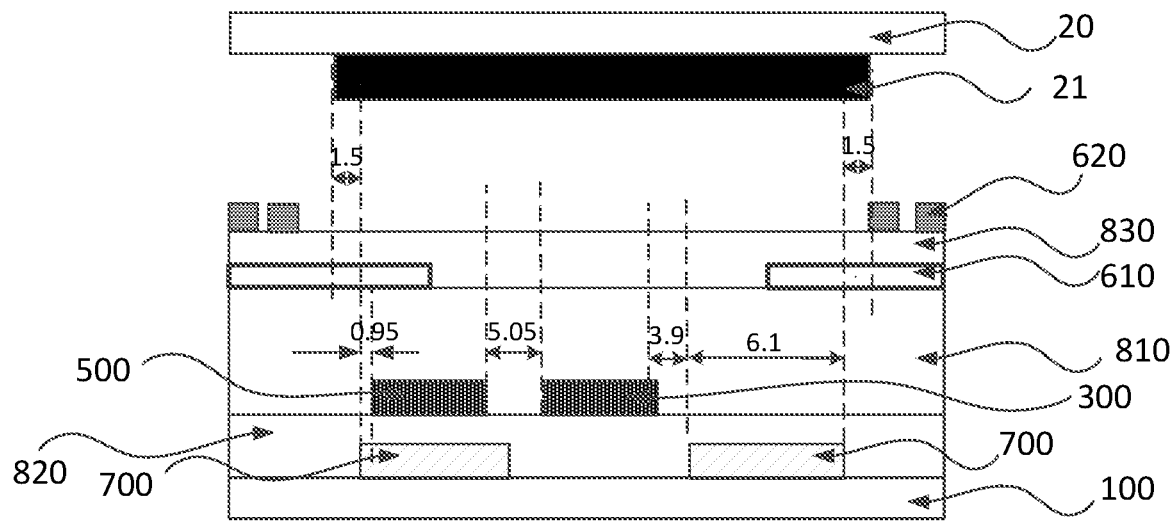
FIG. 2 is a schematic view showing a position relationship among a black matrix, a touch signal line and a data line along line C1-C2 in FIG. 1.

For example, in a direction parallel to the base substrate 100 and perpendicular to the second direction, a size of the touch signal line 500 is less than a size of the first metal strip 710, i.e., a width of the touch signal line 500 is less than a width of the first metal strip 710. As shown in FIG. 2, in the embodiments of the present disclosure, the first metal strip 710 is arranged at a side of the touch signal line 500 close to the base substrate 100, i.e., after the array substrate 10 is arranged opposite to the counter substrate 20 to form a cell, the touch signal line 500 is arranged at a light-emitting surface of the first metal strip 710 facing the display panel. When the width of the first metal strip 710 is greater than the width of the touch signal line 500, the touch signal line 500 is completely wrapped by the first metal strip 710.

As shown in FIG. 2, in the direction parallel to the base substrate 100 and perpendicular to the second direction, a boundary of the orthogonal projection of the first metal strip 710 onto the base substrate 100 exceeds a boundary of the orthogonal projection of the touch signal line 500 onto the base substrate 100 by 0.8 µm to 2.0 µm. To be specific, in actual use, the value may be adjusted in accordance with a specific size of the display panel and a specific size of the sub-pixel 400, e.g., the value may be 0.95 µm.

In addition, as shown in FIG. 2, in the direction parallel to the base substrate 100 and perpendicular to the second direction, a minimum distance between the touch signal line 500 and the data line 300 is 4 µm to 6 µm, and correspondingly, a minimum distance between a boundary of the orthogonal projection of the first metal strip 710 onto the base substrate and a boundary of the orthogonal projection of the data line 300 onto the base substrate is 2.1 µm to 8 µm. To be specific, in actual use, the minimum distances may be adjusted in accordance with a process condition, a specific size of the display panel, and a specific size of the sub-pixel 400, e.g., the minimum distance between the touch signal line 500 and the data line 300 may be 5.05 µm, and the minimum distance between the first metal strip 710 and the data line 300 may be 4.1 µm.

For example, the orthogonal projection of the first metal strip 710 onto the base substrate 100 completely covers the orthogonal projection of the touch signal line 500 onto the base substrate 100. In this regard, it is able to further shield the touch signal line 500, or even shield the touch signal line 500 without the black matrix 21, thereby to further increase the aperture ratio.

In addition, as shown in FIG. 1, in some embodiments of the present disclosure, the touch signal line 500 is provided with a center line extending in the second direction, the first metal strip 710 is provided with a center line extending in the second direction, and an orthogonal projection of the center line of the touch signal line 500 onto the base substrate 100 coincides with an orthogonal projection of the center line of the first metal strip 710 onto the base substrate 100. As shown in FIG. 2, in the embodiments of the present disclosure, a center of the touch signal line 500 coincides with a center of the first metal strip 710, the touch signal line 500 is completely wrapped by the first metal strip 710, and a wrapping degree of the touch signal 500 is the same in the first direction, so it is able for the sub-pixels 400 at two sides of the touch signal line 500 to emit light equally, thereby to ensure a display effect of the display panel.

In addition, as shown in FIG. 2, the orthogonal projection of the metal pattern unit 700 onto the base substrate 100 does not overlap the orthogonal projection of the data line 300 onto the base substrate 100, so as to prevent the metal pattern unit 700 from adversely affecting an electric field of the data line 300.

For example, the array substrate 10 includes a first indium tin oxide (ITO) layer (1ITO layer) and a second ITO layer (2ITO layer), the 1ITO layer is arranged between the base substrate 100 and the 2ITO layer and includes a common electrode 600, and the 2ITO layer includes a pixel electrode 620.

When the orthogonal projection of the touch electrode 600 onto the base substrate 100 overlaps the orthogonal projection of the data line 300 onto the base substrate 100 and the orthogonal projection of the gate line 200 onto the base substrate 100, a signal on the data line 300 and a signal on the gate line 200 may be adversely affected by a signal on the touch electrode 600. In this regard, in some embodiments of the present disclosure, the touch electrode 600 is arranged in the touch region of the array substrate 10, and it includes a plurality of touch sub-electrodes 610 independent of each other. The plurality of touch electrodes 600 is arranged in an array form, i.e., the touch region is divided into a plurality of touch sub-regions T, and each touch electrode 600 is, but not limited to, arranged in a corresponding touch sub-region T.

Each touch electrode 600 includes a plurality of touch sub-electrodes 610, and an orthogonal projection of the touch sub-electrode 610 onto the base substrate 100 does not overlap the orthogonal projection of the gate line 200 onto the base substrate 100 and the orthogonal projection of the data line 300 onto the base substrate 100. The touch sub-electrodes 610 in the same touch electrode 600 are coupled to each other and coupled to a corresponding touch signal line 500, and different touch electrodes 600 are not coupled to each other.

The orthogonal projection of the gate line 200 onto the base substrate 100 and the orthogonal projection of the data line 300 onto the base substrate 100 do not overlap the orthogonal projection of the touch sub-electrode 610 onto the base substrate 100, so it is able to prevent the touch electrode 600 from adversely affecting the signal on the data line 300 and the signal on the gate line 200.

Based on this, in the related art, the plurality of touch sub-electrodes 610 in the touch electrode 600 is coupled to each other through a conductive line arranged at a same layer as the touch electrode 600. Usually, the touch electrode 600 is made of ITO or indium zinc oxide (IZO), so a resistance of the conductive line is large. In the embodiments of the present disclosure, the plurality of touch sub-electrodes 610 in the same touch electrode 600 is coupled to each other through the metal pattern unit 700 and the touch signal line 500, and the metal pattern unit 700 is electrically coupled to the touch electrode 600. A resistance of the metal pattern 700 is less than the resistance of ITO or IZO, so it is able to reduce the resistance of the touch electrode 600.

It should be appreciated that, a specific position of the touch region may be arranged according to the practical need. For example, the touch region coincides with an entire display region of the LCD panel, or the touch region is arranged in the display region and merely coincides with a designated region in the display region. In other words, for the plurality of sub-pixels 400 on the array substrate 10, each sub-pixel 400 is provided with a touch sub-electrode 610, or a part of the sub-pixels 400 are provided with the touch sub-electrodes 610, and the other part of the sub-pixels 400 are not provided with the touch sub-electrodes 610.

Figure 3:
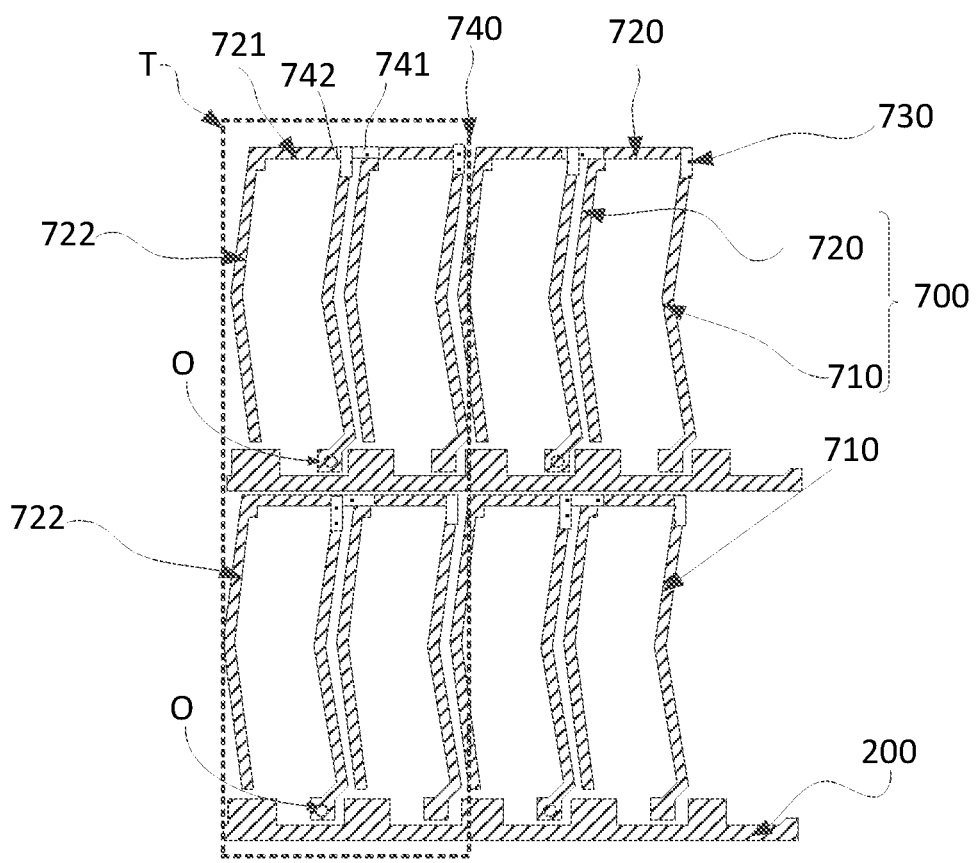
FIG. 3 is a schematic view showing the arrangement of a plurality of metal pattern units in a same touch sub-region and metal pattern units in different touch sub-regions in the array substrate according to one embodiment of the present disclosure.

It should be further appreciated that, the metal pattern unit 700 may be formed independently and not formed at a same layer as an existing pattern layer on the array substrate 10, or the metal pattern unit 700 may be formed at a same layer as the existing pattern layer on the array substrate 10. In some embodiments of the present disclosure, as shown in FIG. 1 to FIG. 3, the metal pattern unit 700 is formed at a same layer as the gate line 200, i.e., the metal pattern unit 700 is formed at a same layer and made of a same material as the gate line 200. When the metal pattern unit 700 is arranged at a same layer and made of a same material as the gate line 200, it is able to form the metal pattern unit 700 and the gate line 200 at the same time, thereby to simplify a manufacture process of the array substrate 10.

In the case that the metal pattern unit 700 is arranged at a same layer and made of a same material as the gate line 200, the metal pattern unit 700 does not overlap the gate line 200. In this regard, the metal pattern unit 700 needs to be designed in such a manner as to be coupled to the touch electrode 600 and the touch signal line 500 to reduce the resistance of the touch electrode 600, enable the touch sub-electrodes 610 in the same touch electrode 600 to be electrically coupled to each other, and enable different touch electrodes 600 to be decoupled from each other.

In this regard, in some embodiments of the present disclosure, as shown in FIG. 1 and FIG. 3, the metal pattern unit 700 further includes a second metal strip 720, and the second metal strip 720 includes a first metal sub-line 721 and a second metal sub-line 722. The first metal sub-line 721 is arranged on at least one side of the gate line and extending in the first direction, and the second metal sub-line 722 is arranged on at least one side of the data line and extending in the second direction. The first metal sub-line 721 is coupled to the second metal sub-line 722, and the second metal sub-line 722 and the first metal strip 710 are arranged at two opposite sides of the sub-pixel respectively.

Based on the above, the metal pattern unit 700 includes the first metal strip 710 and the second metal strip 720, and the second metal strip 720 includes the first metal sub-line 721 and the second metal sub-line 722. In this way, the metal pattern unit 700 surrounds the aperture region of the sub-pixel, so it is able to use the metal pattern unit 700 as a light shielding pattern to event replace the black matrix 21.

In some embodiments of the present disclosure, as shown in FIG. 3, the first metal strip 710 is arranged at a same layer as the second metal strip 720, a first notch 730 is formed between the first metal strip 710 and the second metal strip 720 in a same metal pattern unit 700 in the second direction, and a second notch 740 is formed between two first metal sub-lines 721 in different metal pattern units 700 in the first direction.

For example, as shown in FIG. 3, in a same touch electrode 600, the first metal sub-lines 721 between adjacent metal pattern units 700 in the first direction are coupled to each other through a first bridging portion 741 arranged at a same layer as or a different layer from the first metal strip 710 at the second notch 740, and at least one metal pattern unit is coupled to at least one touch sub-electrode in the touch electrode. In different touch electrodes adjacent to each other in the first direction, the first metal sub-lines 721 between the plurality of metal pattern units 700 are not coupled to each other at the second notch 740.

In the same touch electrode 600, the first metal strip 710 and the second metal strip 720 in each metal pattern unit in at least one column in the second direction are coupled to each other through a second bridging portion 742 arranged at a same layer as or a different layer from the first metal strip 710 at the first notch 730, and the first metal strip 710 is coupled to a corresponding touch signal line 500. The metal pattern units 700 are not coupled to each other between adjacent touch electrodes 600 in the second direction.

Based on the above, the common electrode is made of ITO, and the metal pattern unit 700 is made of a conductive metal. Generally, a resistivity of the conductive metal is far less than a resistivity of ITO. In this regard, when the common electrodes in a same touch sub-region T are coupled to each other through the metal pattern unit 700, it is able to remarkably reduce an overall resistance of the common electrodes in the array substrate 10, thereby to improve uniformity of the resistance of the common electrodes in the same touch sub-region T.

In addition, as shown in FIG. 1 to FIG. 3, the plurality of metal pattern units 700 in a same touch sub-region T is coupled to each other through bridging portions.

To be specific, FIG. 3 shows the arrangement of the plurality of metal pattern units in the same touch sub-region and the metal pattern units in different touch sub-regions in the array substrate. As shown in FIG. 3, in some embodiments of the present disclosure, in the plurality of metal pattern units 700 arranged in the same touch sub-region T, adjacent metal pattern units 700 arranged in the first direction (i.e., a row direction) are coupled to each other through the first bridging portion 741, and the first bridging portion 741 is arranged between first metal sub-lines of two adjacent metal pattern units. The first bridging portion 741 is arranged at the same layer as the first metal sub-line, i.e., the first metal sub-lines of two adjacent metal pattern units are coupled to each other, or the first bridging portion 741 may be arranged at a different layer from the first metal sub-line and may be coupled to the first metal sub-line through a via hole, so that the metal pattern units in the same touch electrode are coupled to each other in the row direction. The metal pattern units 700 in different touch sub-regions T are not coupled to each other in the row direction at the first notch 730.

In the second direction (i.e., a column direction), the first metal strip and the second metal strip 720 are coupled to each other through the second bridging portion 742 arranged at a same layer as or a different layer from the first metal strip 710 at the first notch 730. The second bridging portion 742 is arranged at a same layer as the first metal sub-line, i.e., the first metal sub-lines of two adjacent metal pattern units are coupled to each other, or the second bridging portion 742 is arranged at a different layer from the first metal sub-line and coupled to the first metal sub-line through a via hole. The first metal strips in at least one column in the second direction in the same touch sub-region T are coupled to a same touch signal line (i.e., the touch signal line corresponding to the touch sub-region) through the via hole (the dotted circle O in FIG. 3), and not couple to the other non-corresponding touch signal lines (i.e., touch signal lines not corresponding to the touch sub-region), so that the metal pattern units in the same touch sub-region are coupled to each other through the corresponding touch signal line in the column direction. The first metal strip is merely coupled to the corresponding touch signal line in the column direction and is not coupled to the non-corresponding touch signal lines, so the metal pattern units are not coupled to each other between the adjacent touch electrodes in the second direction.

For example, the first bridging portion 741 and the second bridging portion 742 are not formed on a same layer as an existing pattern layer on the array substrate 10, or formed on a same layer as the existing pattern layer on the array substrate 10. For example, the first bridging portion 741 and the second bridging portion 742 may be formed on a same layer as the gate line 200, i.e., the first bridging portion 741 and the second bridging portion 742 are arranged at a same layer and made of a same material as the gate line 200. When the first bridging portion 741 and the second bridging portion 742 are arranged at a same layer and made of a same material as the gate line 200, it is able to form the metal pattern unit 700 and the gate line 200 at the same time, thereby to simplify the manufacture process of the array substrate 10.

It should be appreciated that, the above are for illustrative purposes only, and in the row direction, the adjacent second metal strips 720 are coupled to each other, and the touch electrode is divided into blocks in the row direction through controlling whether these blocks are coupled to each other at the second notch 740.

In the column direction, the first metal strip 710 and the second metal strip 720 in the metal pattern unit in each touch sub-region are coupled to each other though the second bridging portion arranged at a same layer or a different layer from the first metal strip and the second metal strip. Not all first metal strips 710 are coupled to the touch signal lines 500 through via holes. Merely the touch signal line corresponding to the touch sub-region where the first metal strip 710 is arranged is coupled to the touch electrode through the via hole, and the touch signal lines not corresponding to the first metal strip 710 are not coupled to the touch electrode, i.e., the touch electrode is divided into blocks in the column direction through controlling whether the first metal strip 710 is coupled to different touch signal lines.

Figure 9:
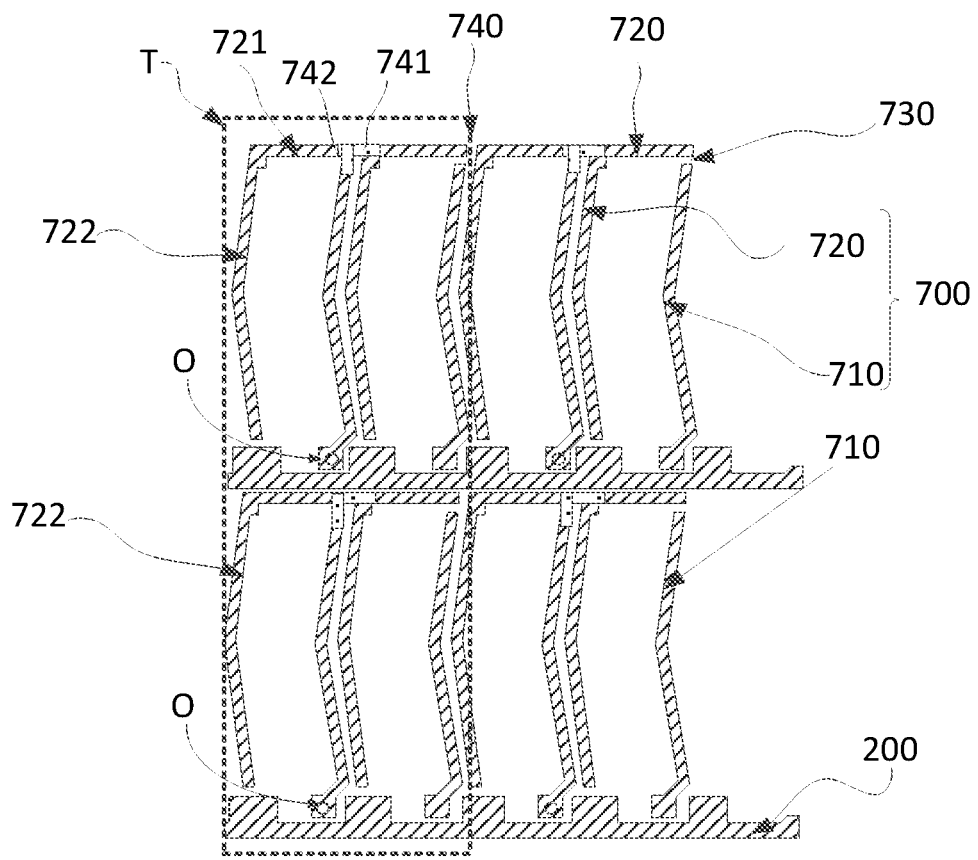
FIG. 9 is yet another schematic view showing the arrangement of the plurality of metal pattern units in the same touch sub-region and the metal pattern units in different touch sub-regions in the array substrate according to one embodiment of the present disclosure.

It should be appreciated that, in some embodiments of the present disclosure, as shown in FIG. 3, the first metal strip 710 and the second metal strip 720 in the metal pattern unit in each touch sub-region are coupled to each other. In some other embodiments of the present disclosure, as shown in FIG. 9, in a part of metal pattern units in the same touch sub-region, the first metal strip and the second metal strip are coupled to each other, and in the other part of the metal pattern units, the first metal strip and the second metal strip are not coupled to each other at the first notch 730.

Figure 8:
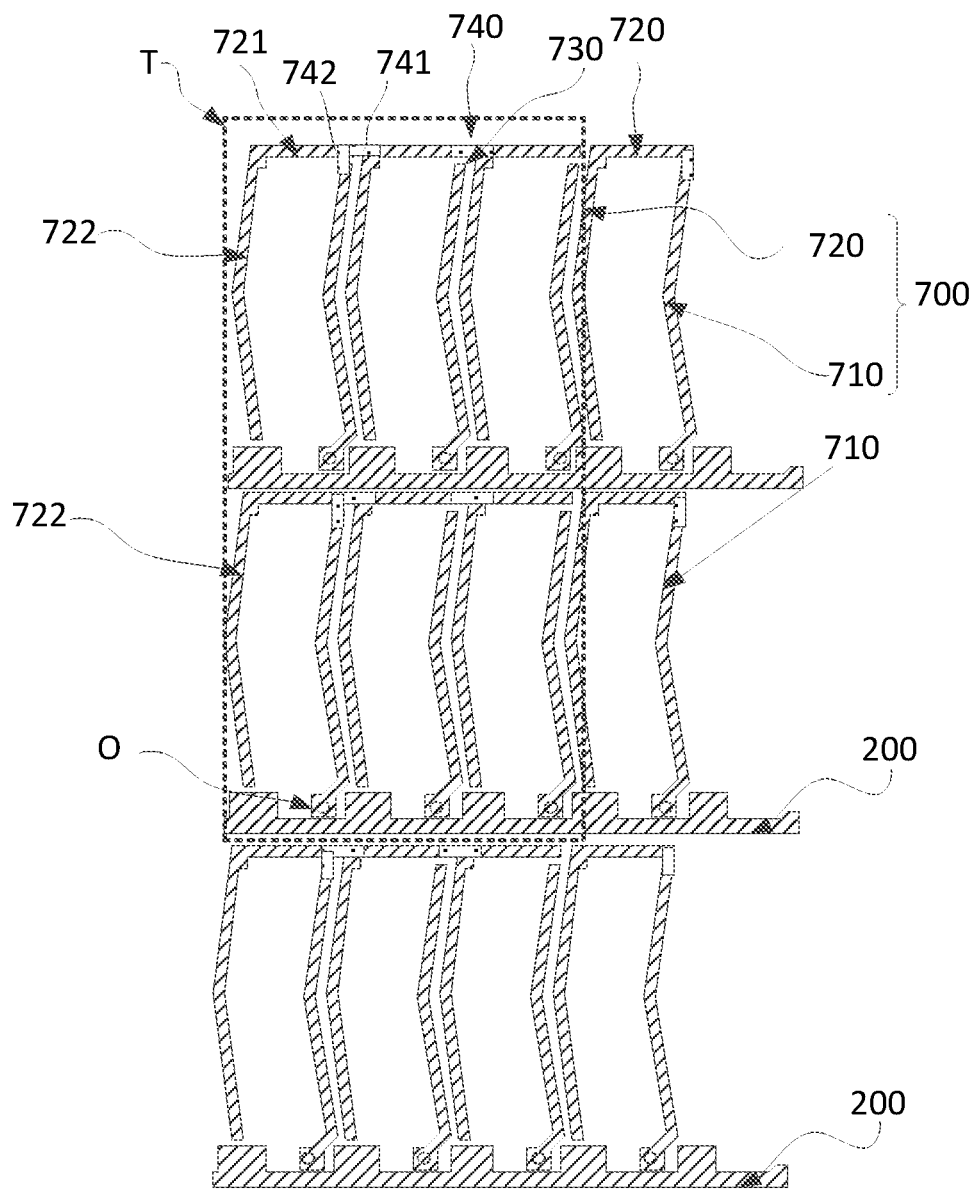
FIG. 8 is another schematic view showing the arrangement of the plurality of metal pattern units in the same touch sub-region and the metal pattern units in different touch sub-regions in the array substrate according to one embodiment of the present disclosure.

In addition, FIG. 8 shows the arrangement of the plurality of metal pattern units in the same touch sub-region and the metal pattern units in different touch sub-regions in the array substrate.

As shown in FIG. 8, in a same touch electrode, the first metal sub-lines between metal pattern units are coupled to each other through a first bridging portion arranged at a same layer as or a different layer from the first metal strip at the second notch, and at least one metal pattern unit is coupled to at least one touch sub-electrode in the touch electrode. In different touch electrodes, the first metal sub-lines between the plurality of metal pattern units are not coupled to each other at the second notch.

In the same touch electrode, the first metal strips in at least two columns in the second direction are coupled to different touch signal lines through via holes (the dotted circle O in FIG. 8), and a first metal strip coupled to the touch signal line not corresponding to the touch electrode is not coupled to the second metal strip in the touch electrode at the first notch, so that the metal pattern units are not coupled to each other between the adjacent touch electrodes in the second direction.

In the embodiments of the present disclosure, in the row direction, the adjacent second metal strips 720 are coupled to each other, and the touch electrode is divided into blocks in the row direction through controlling whether these blocks are coupled to each other at the second notch 740.

In the column direction, the first metal strips 710 are all coupled to the touch signal lines 500 through the via holes. Through the first notch 730, the touch signal line is coupled to the touch electrode corresponding to the touch signal line, and the touch signal line is not coupled to the touch electrode not corresponding to the touch signal line, so it is able to divide the touch electrode into blocks in the column direction.

In addition, in the embodiments of the present disclosure, as shown in FIG. 1 to FIG. 3, in two adjacent metal pattern units 700, the first metal strip 710 in one metal pattern unit 700 and the second metal sub-line 722 in the other metal pattern unit 700 are arranged at two opposite sides of a same data line 300, and in a direction parallel to the base substrate 100 and perpendicular to the second direction, a distance between a boundary of an orthogonal projection of the first metal strip 710 in one metal pattern unit 700 onto the base substrate 100 and a boundary of the orthogonal projection of the data line 300 onto the base substrate 100 is the same as a distance between a boundary of an orthogonal projection of the second metal sub-line 722 in the other metal pattern unit 700 onto the base substrate 100 and the boundary of the orthogonal projection of the data line 300 onto the base substrate 100.

In some embodiments of the present disclosure, as shown in FIG. 1 to FIG. 3, the orthogonal projection of the first metal sub-line 721 onto the base substrate 100 and the orthogonal projection of the second metal sub-line 722 onto the base substrate 100 are completely covered by an orthogonal projection of a light shielding strip of the black matrix 21 on the counter substrate 20 onto the base substrate 100. For example, in the direction parallel to the base substrate 100 and perpendicular to the first direction, the boundary of the orthogonal projection of the black matrix 21 onto the base substrate 100 exceeds the boundary of the orthogonal projection of the first metal strip 710 onto the base substrate 100 by 1 µm to 3 µm. To be specific, in actual use, the value may be adjusted in accordance with a specific size of the display panel and a specific size of the sub-pixel 400, e.g., the boundary of the orthogonal projection of the black matrix 21 onto the base substrate 100 exceeds the boundary of the orthogonal projection of the first metal strip 710 onto the base substrate 100 by 1.5 µm.

Identically, in the direction parallel to the base substrate 100 and perpendicular to the first direction, the boundary of the orthogonal projection of the black matrix 21 onto the base substrate 100 exceeds the boundary of the orthogonal projection of the second metal strip 720 onto the base substrate 100 by 1 µm to 3 µm. To be specific, in actual use, the value may be adjusted in accordance with a specific size of the display panel and a specific size of the sub-pixel 400, e.g., the boundary of the orthogonal projection of the black matrix 21 onto the base substrate 100 exceeds the boundary of the orthogonal projection of the second metal strip 720 onto the base substrate 100 by 1.5 µm.

In addition, in some embodiments of the present disclosure, in the direction parallel to the base substrate 100 and perpendicular to the second direction, a distance between a boundary of the orthogonal projection of the data line 300 onto the base substrate 100 and a boundary of an orthogonal projection of the pixel electrode 620 in one sub-pixel 400 adjacent to the data line 300 onto the base substrate 100 is the same as a distance between the boundary of the orthogonal projection of the data line 300 onto the base substrate 100 and a boundary of an orthogonal projection the pixel electrode 620 in the other sub-pixel 400 adjacent to the data line 300 onto the base substrate 100, and a distance between the boundary of the orthogonal projection of the data line 300 onto the base substrate 100 and a boundary of an orthogonal projection of the common electrode in one sub-pixel 400 adjacent to the data line 300 onto the base substrate 100 is the same as a distance between the boundary of the orthogonal projection of the data line 300 onto the base substrate 100 and a boundary of an orthogonal projection the common electrode in the other sub-pixel 400 adjacent to the data line 300 onto the base substrate 100.

Based on the above, the 1ITO and the 2ITO are symmetrical with respect to the data line 300, i.e., a distance between the data line 300 and an electrode on the left is the same as a distance between the data line 300 and an electrode on the right. In this way, it is able to reduce defects caused by different parasitic capacitances between the data line and each of the electrode on the left and the electrode on the right.

In addition, in the embodiments of the present disclosure, the array substrate 10 further includes an organic insulation layer 810, the touch signal line 500 is arranged at a same layer and made of a same material as the data line 300, and the organic insulation layer 810 is arranged between a layer where the data line 300 is located and a layer where the touch electrode 600 is located.

Based on the above, in the embodiments of the present disclosure, the organic insulation layer 810 has a large thickness and it functions as to provide a flat surface. At least a part of the organic insulation layer 810 is arranged between the touch signal line 500 and the common electrode, so as to increase a distance between the touch signal line 500 and the pixel electrode 620, prevent the occurrence of non-uniform left electric fields between the pixel electrode 620 and the touch signal line 500 caused by any process fluctuations of the pixel electrode 620, and improve a transmittance deviation at the aperture region, thereby to prevent the occurrence of non-uniform brightness caused by the transmittance deviation as well as black or white contaminants, and improve the yield of the product.

In the case that the common electrode serves as the touch electrode 600 in the same touch sub-region T, after the LCD panel is formed using the array substrate 10, a specific process of achieving the touch function will be described as follows.

At a touch stage, the touch signal line 500 provides a touch signal to the common electrode (i.e., the touch electrode 600) coupled to the touch signal line 500. When a touch operation is made in a touch region of the LCD panel, the touch signal corresponding to the touch electrode 600 at a touch position changes. The touch electrode 600 transmits the changed touch signal to a chip through the corresponding touch signal line 500, and the chip determines the touch position in accordance with the changed touch signal. At the display stage, the touch signal line 500 provides a common electrode signal for display to the common electrode coupled to the touch signal line 500, and a driving circuitry of the sub-pixel 400 in the array substrate 10 provides a driving signal to a corresponding pixel electrode 620, so as to generate an electric field for driving liquid crystals to deflect between the pixel electrode 620 and the common electrode, thereby to achieve the display function of the LCD panel.

In addition, as shown in FIG. 2, in some embodiments of the present disclosure, the array substrate 10 further includes a gate insulation (GI) layer 820 and a passivation layer 830. A layer where the metal pattern unit 700 is located, the gate insulation layer 820, the layer where the touch signal line 500 and the data line 300 are located, the organic insulation (ORG) layer 810, the layer where the touch electrode 600 is located, the passivation (PVX) layer 830 and a layer where the pixel electrode 620 is located are laminated one on another in a direction away from the base substrate 100. The touch electrode 600 is coupled to the metal pattern unit 700 through a first connection hole Via1, and the first connection hole Via1 at least penetrates through the passivation layer 830, the organic insulation layer 810 and the gate insulation layer 820. The touch signal line 500 is coupled to the metal pattern unit 700 through a second connection hole Via2, and the second connection hole Via2 at least penetrates through the passivation layer 830, the organic insulation layer 810 and the gate insulation layer 820.

Figure 4:
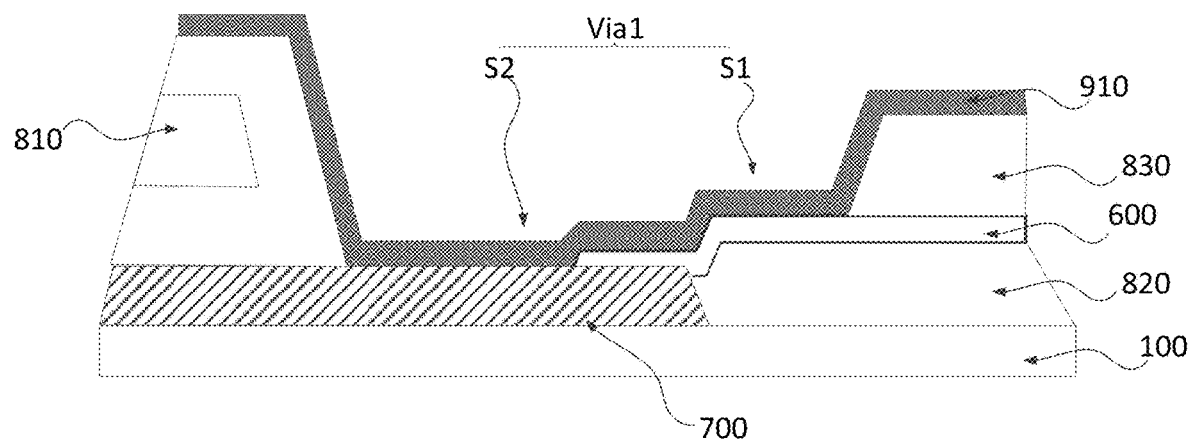
FIG. 4 is a sectional view of the array substrate along line D1-D2 in FIG. 1.

As shown in FIG. 4, for example, the first connection hole Via1 includes a first sub-hole S1 and a second sub-hole S2; the first sub-hole S1 penetrates through the passivation layer 830 to expose a part of the touch electrode 600. The second sub-hole S2 penetrates through the organic insulation layer 810 and the gate insulation layer 820 to exposes a part of the metal pattern unit 700. The array substrate 10 further includes a first connection pattern 910, and an orthogonal projection of the first connection pattern 910 onto the base substrate 100 covers an orthogonal projection of the first sub-hole S1 of the first connection hole Via1 onto the base substrate 100 and an orthogonal projection of the second sub-hole S2 of the first connection hole Via1 onto the base substrate 100 to enable the touch electrode 600 to be coupled to the metal pattern unit 700.

Figure 5:
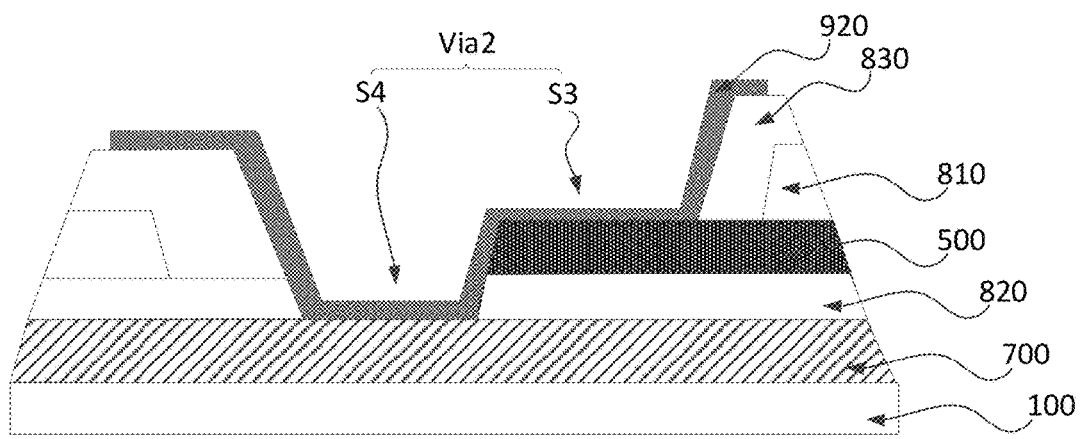
FIG. 5 is a sectional view of the array substrate along line A1-A2 in FIG. 1.

In the embodiments of the present disclosure, as shown in FIG. 5, the second connection hole Via2 includes a third sub-hole S3 and a fourth sub-hole S4. The third sub-hole S3 penetrates through the passivation layer 830 to expose a part of the touch signal line 500, and the fourth sub-hole S4 penetrates through the organic insulation layer 810 and the gate insulation layer 820 to expose a part of the metal pattern unit 700. The array substrate 10 further includes a second connection pattern 920, and an orthogonal projection of the second connection pattern 920 onto the base substrate 100 covers an orthogonal projection of the third sub-hole S3 of the second connection hole Via2 onto the base substrate 100 and an orthogonal projection of the fourth sub-hole S4 of the second connection hole Via2 onto the base substrate 100 to enable the touch signal line to be coupled to the metal pattern unit 700.

Based on the above, the touch electrode 600 is coupled to the metal pattern through the first connection pattern 910. The orthogonal projection of the first connection pattern 910 onto the base substrate 100 covers the orthogonal projection of the first sub-hole S1 of the first connection hole Via1 onto the base substrate 100 and the orthogonal projection of the second sub-hole S2 of the first connection hole Via1 onto the base substrate 100. In the embodiments of the present disclosure, during the manufacture of the array substrate 10, the via hole in the organic insulation layer 810 (i.e., corresponding to the first sub-hole S1 of the first connection hole) is removed through a single patterning process to expose a part of the touch electrode 600. When the via hole in the passivation layer 830 is formed through another patterning process, the gate insulation layer 820 and the passivation layer 830 on the metal pattern unit 700 are removed simultaneously to expose a part of the metal pattern unit. In this way, it is unnecessary to provide a separate etching step for the gate insulation layer 820 and save a mask process, thereby to simplify the manufacture of the array substrate 10 and reduce the manufacture cost of the array substrate 10.

In some embodiments of the present disclosure, the first connection pattern 910 and the second connection pattern 920 are arranged at a same layer and made of a same material as the pixel electrode 620, so as to form the first connection pattern 910, the second connection pattern 920 and the pixel electrode 620 through a single patterning process, thereby to simplify the manufacture of the array substrate 10 and reduce the manufacture cost of the array substrate 10. Of course, it should be appreciated that, the first connection pattern 910 and the second connection pattern 920 may also be formed separately.

Figure 6:
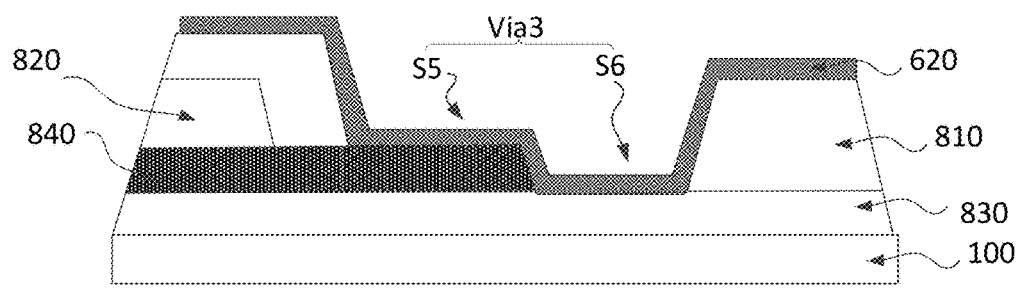
FIG. 6 is a sectional view of the array substrate along line B1-B2 in FIG. 1.
Figure 7:
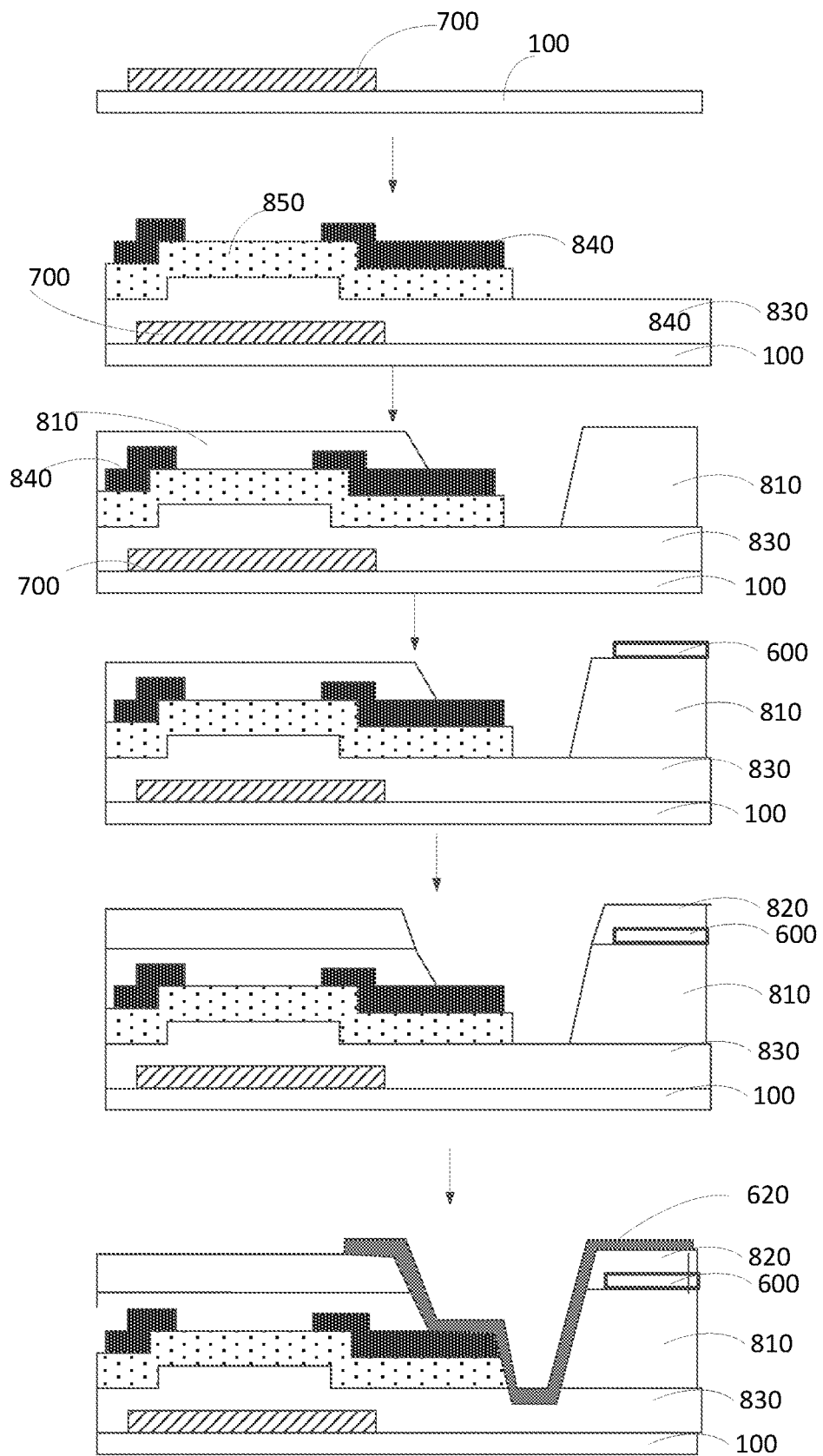
FIG. 7 is a schematic view showing the manufacture of the array substrate according to one embodiment of the present disclosure.

In addition, in some embodiments of the present disclosure, as shown in FIG. 6, the array substrate 10 further includes a driving circuitry, and at least a part of an output electrode 840 of the driving circuitry is arranged at a side of the organic insulation layer 810 close to the base substrate 100. The pixel electrode 620 is coupled to the output electrode 840 through a third connection hole Via3, and the third connection hole Via3 at least penetrates through the organic insulation layer 810 and the passivation layer 830 to expose the output electrode 840 of the driving circuitry and enable the pixel electrode 620 to be coupled to the output electrode 840.

In the embodiments of the present disclosure, the driving circuitry includes a driving transistor, the third connection hole Via3 includes a fifth sub-hole S5 and a sixth sub-hole S6, the fifth sub-hole S5 penetrates through the organic insulation layer 810, the sixth sub-hole S6 penetrates through the passivation layer 830, an orthogonal projection of the fifth sub-hole S5 onto the base substrate 100 covers an orthogonal projection of the sixth sub-hole S6 onto the base substrate 100, and the pixel electrode 620 is coupled to the output electrode 840 through the third connection hole Via3.

Based on the above, a gate electrode of the TFT is coupled to a corresponding gate line 200, an input electrode of the TFT is coupled to a corresponding data line 300, an output electrode 840 of the TFT serves as an output electrode 840 of the driving circuitry, and the output electrode 840 is coupled to the pixel electrode 620. In the embodiments of the present disclosure, the output electrode 840 includes a source electrode.

In the embodiments of the present disclosure, the output electrode 840 is arranged at a same layer and made of a same material as the data line 300 and the touch signal line 500. As shown in FIG. 1 to FIG. 9, the gate insulation layer 820, the output electrode 840, the organic insulation layer 810, the common electrode, the passivation layer 830, and the pixel electrode 620 are laminated one on another in a direction away from the base substrate 100.

In the embodiments of the present disclosure, after the formation of the organic insulation layer 810, a fifth sub-hole S5 penetrating through the organic insulation layer 810 is formed through a single patterning process. Then, the passivation layer 830 is formed, and a sixth sub-hole S6 penetrating through the passivation layer 830 is formed through another patterning process. It should be appreciated that, a part of the passivation layer 830 is located in the fifth sub-hole S5, and this part is etched to form the sixth sub-hole S6. An orthogonal projection of the fifth sub-hole S5 onto the base substrate 100 surrounds an orthogonal projection of the sixth sub-hole S6 onto the base substrate 100. The pixel electrode 620 is formed and coupled to the output electrode 840 through the first sub-hole S1 and second sub-hole S2.

According to the display substrate in the embodiments of the present disclosure, at least a part of an orthogonal projection of a boundary of the fifth sub-hole S5 onto the base substrate 100 at least partially overlaps an orthogonal projection of the output electrode 840 onto the base substrate 100, so at least a part of the boundary of the fifth sub-hole S5 is located on the output electrode 840, and thereby at least a part of a boundary of the sixth sub-hole S6 is located on the output electrode 840. In this way, it is able to prevent the pixel electrode 620 from being completely interrupted at the boundary of the output electrode 840, thereby to ensure the connection between the pixel electrode 620 and the output electrode 840.

In the related art, in order to reduce a resistance of the pixel electrode, the pixel electrode is provided with a plurality of slits. In order to achieve a normal display function of the LCD panel, an extension direction of grooves in an alignment layer needs to be the same as an extension direction of the slits, i.e., during the alignment, an alignment cloth needs to rub an alignment film in a direction perpendicular to an extension direction of the data line. When a rubbing operation is made through the alignment cloth near the data line, the alignment cloth needs to climb at the data line. At this time, a large rubbing shadow region will occur near the data line, and light leakage easily occurs. Hence, the rubbing shadow region needs to be shielded by the black matrix pattern on the counter substrate after the array substrate is arranged opposite to the counter substrate to form a cell. A width of the black matrix pattern in the direction perpendicular to the extension direction of the data line is increased and an aperture ratio of the LCD panel is reduced.

Based on the above problems, it is found through research that, through changing the extension direction of the slit, the extension direction of the slits is enabled to be the same as the extension direction of the data line and the extension direction of the groove after the alignment is enabled to be the same as the extension direction of the data line. In this way, it is able to prevent the rubbing shadow region from being formed near the data line during the alignment and reduce a width of the black matrix pattern for shielding the data line in the direction perpendicular to the extension direction of the data line, thereby to effectively increase the aperture ratio of the LCD panel.

In a possible embodiment of the present disclosure, as shown in FIG. 1, each pixel electrode 620 includes a plurality of slits 620a extending in the second direction.

Here, when the slit 620a extends in the second direction, it means that the slit 620a extends in the second direction as a whole. In a possible embodiment of the present disclosure, the pixel electrode 620 includes a domain, and the slit 620a is of a linear shape. In another possible embodiment of the present disclosure, the pixel electrode 620 is divided into two domains, and as shown in FIG. 1, each slit 620a includes a first sub-slit and a second sub-slit angled relative to the first sub-slit by an obtuse angle θ.

The alignment layer is formed on the array substrate as follows. An alignment material film is formed on a side of the array substrate with the pixel electrode, and then rubbed with an alignment cloth in the extension direction of the slit in the pixel electrode (i.e., the extension direction of the data line) to form the alignment layer with a groove. The extension direction of the groove is the same as the extension direction of the slit.

The slit 620a extends in the second direction, and when the alignment film is aligned through the alignment cloth, the alignment cloth moves along the second direction, so it is able to prevent the occurrence of a large rubbing shadow region near the data line during the alignment. At this time, there is no light leakage caused by the rubbing shadow region, so it is able to provide the light shielding strip in the black matrix 21 with a small width in the first direction, thereby to effectively increase the aperture ratio.

As shown in FIG. 1, in the embodiments of the present disclosure, the second metal strip 720 is coupled to the touch electrode through the first connection hole Via1. In order to avoid the first connection hole, the pixel electrode is provided with a notch. A length of the slit 620a in a region corresponding to the notch in the second direction is less than a length of the slit 620a in the other region in the second direction. As shown in FIG. 1, each pixel electrode includes 7 slits, and upper ends and lower ends of the two slits at a side close to the second metal sub-line are aligned. A length of each of the two slits is less than a length of each of the other five slits at a side close to the first metal strip. Upper ends and lower ends of the five slits at the side close to the first metal strip are aligned.

Of course, the above are for illustrative purposes only, and in actual use, the quantity and length of the slits are not limited thereto.

It should be appreciated that, FIG. 1 shows the arrangement of the sub-pixels in the array substrate. In FIG. 1, a line includes a curved portion with a sharp angle. In an actual product, due to the manufacture process, the curved portion should be rounded, which is not shown in FIG. 1 for ease of drawing.

The present disclosure further provides in some embodiments a display device, including an array substrate 10, a counter substrate 20 arranged opposite to the array substrate 10, and a liquid crystal layer arranged between the array substrate 10 and the counter substrate 20. The array substrate 10 is the above-mentioned array substrate.

A black matrix 21 is arranged on the counter substrate 20, and an orthogonal projection of the black matrix 21 onto the array substrate is within the light shielding region of the sub-pixel. In the direction parallel to the base substrate and perpendicular to the second direction, a distance between a boundary of an orthogonal projection of the black matrix onto the base substrate and the boundary of the orthogonal projection of the pixel electrode in one sub-pixel adjacent to the black matrix onto the base substrate is the same as a distance between the boundary of the orthogonal projection of the black matrix onto the base substrate and a boundary of the orthogonal projection the pixel electrode in the other sub-pixel adjacent to the black matrix onto the base substrate, and a distance between the boundary of the orthogonal projection of the black matrix onto the base substrate and the boundary of the orthogonal projection of the common electrode in one sub-pixel adjacent to the data line onto the base substrate is the same as a distance between the boundary of the orthogonal projection of the black matrix onto the base substrate and a boundary of an orthogonal projection the common electrode in the other sub-pixel adjacent to the black matrix onto the base substrate.

Based on the above, the 1ITO and the 2ITO are symmetrical with respect to the black matrix 21, i.e., a distance between the black matrix 21 and an electrode on the left is the same as a distance between the black matrix 21 and an electrode on the right, so as to improve a shielding effect of the black matrix on the sub-pixel, thereby to improve the uniformity of the light transmittance of the sub-pixel, i.e., the symmetry of the pixel.

It should be appreciated that, the display device may be any product or member having a display function, such as a liquid crystal display panel, a television, a monitor, a digital photo frame, a mobile phone, an electronic paper, a tablet computer, a laptop computer, or a navigator.

The display device includes the above-mentioned array substrate 10, so it has the same beneficial effects, which will thus not be particularly defined herein.

The present disclosure further provides in some embodiments a method for manufacturing the array substrate 10, including the following steps.

Step S01: providing a base substrate 100.

Step S02: forming a plurality of gate lines 200, a plurality of data lines 300, a plurality of touch signal lines 500, a plurality of touch electrodes 600 and a plurality of metal pattern units 700 on the base substrate 100. The plurality of gate lines 200 extends in a first direction, the plurality of data lines 300 extends in a second direction, and the plurality of gate lines 200 and the plurality of data lines 300 cross each other to define a plurality of sub-pixels 400. The plurality of touch signal lines 500 extends in the second direction, and each touch signal line 500 is arranged in a light shielding region between adjacent sub-pixels 400. The plurality of touch electrodes 600 is insulated from each other. Each metal pattern unit 700 is arranged in the light shielding region between adjacent sub-pixels 400, one metal pattern unit 700 corresponds to one touch electrode 600, the touch electrode 600 is coupled to a corresponding touch signal line 500 through the corresponding metal pattern unit 700, and an orthogonal projection of the metal pattern unit 700 onto the base substrate 100 at least overlaps a part of an orthogonal projection of the touch signal line 500 onto the base substrate 100.

According to the method in the embodiments of the present disclosure, the touch signal line 500 and the data line 300 are arranged in parallel and the touch signal line 500 is arranged in the light shielding region between adjacent sub-pixels 400. In this regard, the touch signal line 500 and the data line 300 are covered by the black matrix 21 on the counter substrate 20, so it is able to prevent the occurrence of non-uniform electric fields between the touch signal line and each of the electrode on the left and the electrode on the right when the touch signal line 500 is arranged in the middle of the sub-pixel 400, thereby to prevent the occurrence of contaminants. In addition, the touch electrode 600 is electrically coupled to the touch signal line 500 through the metal pattern, so it is able to reduce the resistance of the touch electrode 600 as well a loss on the touch signal line 500, thereby to improve the touch sensitivity and the product quality. In addition, the touch signal line 500 is at least partially covered by the metal pattern unit, and the metal pattern unit also functions as to shield light, so it is able to reduce the dependence on the black matrix 21, thereby to reduce the light shielding area of the black matrix 21 on the counter substrate 20.

In the embodiments of the present disclosure, Step S02 further includes the following steps.

Step S021: forming the gate line 200, a gate electrode of the driving transistor, and the metal pattern unit 700 on the base substrate 100. The metal pattern unit 700 is coupled to the common electrode to reduce a transmission resistance of the common electrode.

To be specific, a first gate metal layer (Gate layer) is formed on the base substrate 100, and it includes a first molybdenum layer, a first aluminum layer and a second molybdenum layer laminated one on another in a direction away from the base substrate 100. A thickness of the first molybdenum layer is 150 Å, a thickness of the first aluminum layer is 3000 Å, and a thickness of the second molybdenum layer is 800 Å. The first gate metal layer is subjected to a patterning process to form the gate line 200, the gate electrode and the metal pattern unit 700. The patterning process includes coating, exposing, developing, and wet etching. In some embodiments of the present disclosure, the metal pattern unit 700 further includes the first bridging portion 741 and the second bridging portion 742 coupled to the metal pattern unit 700 in a same touch sub-region T.

Step S022: forming the driving circuitry, the data line 300 and the touch signal line 500 on the base substrate 100 on which the gate line 200 and the metal pattern unit 700 are formed.

To be specific, in Step S022, an entire gate insulation layer 820 is deposited to cover the gate line 200, the gate electrode and the metal pattern unit 700, a material of the gate insulation layer 820 includes silicon nitride, and a thickness of the gate insulation layer 820 is 4000 Å.

Next, an active layer of the TFT is formed and it has a thickness of 1700 Å.

Then, a source/drain metal layer of the TFT is formed. The source/drain metal layer includes a third molybdenum layer, a second aluminum layer and a fourth molybdenum layer laminated one on another in a direction away from the base substrate 100. A thickness of the third molybdenum layer is 150 Å, a thickness of the second aluminum layer is 3000 Å, and a thickness of the fourth molybdenum layer is 800 Å. The source/drain metal layer is subjected to a patterning process to form the input electrode and the output electrode 840 of the driving circuitry, the data line 300, and the touch signal line 500. The patterning process includes coating, exposing, developing, and wet etching.

Step S023: forming the organic insulation layer 810 on the base substrate 100 on which the driving circuitry is formed. The organic insulation layer 810 covers the output electrode 840 of the driving circuitry, the data line 300, and the touch signal line 500.

To be specific, in the embodiments of the present disclosure, a silicon nitride material is deposited to form a buffer layer with a thickness of 1000 Å, and then an organic resin is deposited at a side of the buffer layer away from the base substrate 100 to form the entire organic insulation layer 810 with a thickness of 20000 Å.

A second sub-hole S2, a fourth sub-hole S4, and a fifth sub-hole S5 are formed in the organic insulation layer 810 through a single patterning process. The second sub-hole S2 and the fourth sub-hole S4 penetrate through the organic insulation layer 810 to expose at least a part of the metal pattern unit 700, and the fourth sub-hole S4, the third sub-hole S3 and the fifth sub-hole S5 penetrate through the organic insulation layer 810 to expose at least a part of the output electrode 840 of the driving circuitry.

Step S024: forming the common electrode.

To be specific, in Step S024, the 1ITO layer is made of indium tin oxide with a thickness of 700 Å. The 1ITO layer is subjected to a patterning process to form the common electrode, and the patterning process includes coating, exposing, developing, and wet etching.

Step S025: forming the passivation layer 830 to cover the common electrode.

To be specific, in Step S025, a silicon nitride material is deposited to from the entire passivation layer 830 with a thickness of 2500 Å.

To be specific, in Step S025, the passivation layer 830 is subject to a single patterning process to form the first sub-hole S1, the third sub-hole S3 and a sixth sub-hole S6 penetrating through the passivation layer 830. The first sub-hole S1 penetrates through the passivation layer 830 to expose a part of the touch electrode 600, the third sub-hole S3 penetrates through the passivation layer 830 to expose a part of the touch signal line 500, the sixth sub-hole S6 penetrates through the passivation layer 830, and an orthogonal projection of the fifth sub-hole S5 onto the base substrate 100 includes an orthogonal projection of the sixth sub-via onto the base substrate 100.

Step S026: forming the pixel electrode 620, the first connection pattern 910 and the second connection pattern 920. The orthogonal projection of the first connection pattern 910 onto the base substrate 100 covers the orthogonal projection of the first sub-hole S1 of the first connection hole Via1 onto the base substrate and the orthogonal projection of the second sub-hole S2 of the first connection hole Via1 onto the base substrate to couple the touch electrode 600 to the metal pattern unit, and the orthogonal projection of the second connection pattern 920 onto the base substrate 100 covers the orthogonal projection of the third sub-hole S3 of the second connection hole Via2 onto the base substrate and the orthogonal projection of the fourth sub-hole S4 of the second connection hole Via2 onto the base substrate to couple the touch signal line 500 to the metal pattern unit.

To be specific, in Step S026, the 2ITO layer may be made of indium tin oxide material with a thickness of 700 Å. The 2ITO layer is subjected to a patterning process to form the pixel electrode 620, the first connection pattern 910 and the second connection pattern 920, and the patterning process includes coating, exposing, developing, and wet etching.

Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. An array substrate, comprising a base substrate, and a plurality of gate lines extending in a first direction and a plurality of data lines extending in a second direction arranged on the base substrate, wherein each gate line crosses the plurality of data lines to define a plurality of sub-pixels, wherein the array substrate further comprises:
   a plurality of touch signal lines extending in the second direction and arranged in light shielding regions of the sub-pixels;
   a plurality of touch electrodes insulated from each other and each coupled to at least one touch signal line; and
   a plurality of metal pattern units corresponding to the sub-pixels respectively and each arranged in the light shielding region of the corresponding sub-pixel,
   wherein the metal pattern unit comprises a first metal strip arranged on at least one side of the data line and extending in the second direction, an overlapping area between an orthogonal projection of the first metal strip onto the base substrate and an orthogonal projection of the touch signal line onto the base substrate is A, and a ratio of the overlapping area A to an area of the orthogonal projection of the touch signal line onto the base substrate is greater than a threshold;
   wherein the metal pattern unit further comprises a second metal strip, and the second metal strip comprises a first metal sub-line arranged on at least one side of the gate line and extending in the first direction, and a second metal sub-line arranged on at least one side of the data line and extending in the second direction, wherein the first metal sub-line is coupled to the second metal sub-line, and the second metal sub-line and the first metal strip are arranged at two opposite sides of the sub-pixel respectively.

2. The array substrate according to claim 1, wherein in a direction parallel to the base substrate and perpendicular to the second direction, a size of the touch signal line is less than a size of the first metal strip.

3. The array substrate according to claim 2, wherein in the direction parallel to the base substrate and perpendicular to the second direction, a boundary of the orthogonal projection of the first metal strip onto the base substrate exceeds a boundary of the orthogonal projection of the touch signal line onto the base substrate by 0.8 μm to 2.0 μm.

4. The array substrate according to claim 3, wherein the touch signal line is provided with a center line extending in the second direction, the first metal strip is provided with a center line extending in the second direction, and an orthogonal projection of the center line of the touch signal line onto the base substrate coincides with an orthogonal projection of the center line of the first metal strip onto the base substrate.

5. The array substrate according to claim 1, wherein the orthogonal projection of the first metal strip onto the base substrate does not overlap an orthogonal projection of the data line onto the base substrate.

6. The array substrate according to claim 5, wherein in a direction parallel to the base substrate and perpendicular to the second direction, a minimum distance between a boundary of the orthogonal projection of the first metal strip onto the base substrate and a boundary of the orthogonal projection of the data line onto the base substrate is 2.1 μm to 8 μm.

7. The array substrate according to claim 1, wherein the first metal strip is arranged at a same layer as the second metal strip, a first notch is formed between the first metal strip and the second metal strip of a same metal pattern unit in the second direction, and a second notch is formed between two first metal sub-lines of different metal pattern units in the first direction.

8. The array substrate according to claim 7, wherein each touch electrode comprises a plurality of touch sub-electrodes, and an orthogonal projection of the touch sub-electrode onto the base substrate does not overlap an orthogonal projection of the gate line onto the base substrate and an orthogonal projection of the data line onto the base substrate;

in a same touch electrode, the first metal sub-lines in the plurality of metal pattern units are coupled to each other through a first bridging portion arranged at a same layer as or a different layer from the first metal strip at the second notch, and at least one metal pattern unit is coupled to at least one touch sub-electrode in the touch electrode;

in different touch electrodes, the first metal sub-lines between the plurality of metal pattern units are not coupled to each other at the second notch;

in the same touch electrode, the first metal strip and the second metal strip in each of the metal pattern units in at least one column in the second direction are coupled to each other through a second bridging portion arranged at a same layer as or a different layer from the first metal strip at the first notch, and the first metal strip is coupled to a corresponding touch signal line; and the metal pattern units are not coupled to each other between the adjacent touch electrodes in the second direction.

9. The array substrate according to claim 8, wherein in the same touch electrode, each first metal strip in the first metal strips in at least one column in the second direction is coupled to the corresponding touch signal line, and all first metal strips corresponding to the touch electrode are not coupled to the touch signal lines not corresponding to the touch electrode so that the metal pattern units are not coupled to each other between the adjacent touch electrodes in the second direction; or in the same touch electrode, the first metal strips in at least two columns in the second direction are coupled to different touch signal lines, and the first metal strip coupled to the touch signal line not corresponding to the touch electrode is not coupled to the second metal strip in the touch electrode at the first notch so that the metal pattern units are not coupled to each other between the adjacent touch electrodes in the second direction.

10. The array substrate according to claim 8, further comprising a pixel electrode and a common electrode arranged in each sub-pixel, wherein the touch sub-electrode serves as the common electrode.

11. The array substrate according to claim 10, wherein in the direction parallel to the base substrate and perpendicular to the second direction, a distance between a boundary of the orthogonal projection of the data line onto the base substrate and a boundary of an orthogonal projection of the pixel electrode in one sub-pixel adjacent to the data line onto the base substrate is the same as a distance between the boundary of the orthogonal projection of the data line onto the base substrate and a boundary of an orthogonal projection the pixel electrode in the other sub-pixel adjacent to the data line onto the base substrate, and a distance between the boundary of the orthogonal projection of the data line onto the base substrate and a boundary of an orthogonal projection of the common electrode in one sub-pixel adjacent to the data line onto the base substrate is the same as a distance between the boundary of the orthogonal projection of the data line onto the base substrate and a boundary of an orthogonal projection the common electrode in the other sub-pixel adjacent to the data line onto the base substrate.

12. The array substrate according to claim 11, further comprising an organic insulation layer, wherein the touch signal line is arranged at a same layer and made of a same material as the data line, and the organic insulation layer is arrange between a layer where the data line is located and a layer where the touch electrode is located.

13. The array substrate according to claim 12, further comprising a gate insulation layer and a passivation layer, wherein a layer where the metal pattern unit is located, the gate insulation layer, a layer where the touch signal line and the data line are located, the organic insulation layer, the layer where the touch electrode is located, the passivation layer and a layer where the pixel electrode is located are laminated one on another in a direction away from the base substrate, the touch electrode is coupled to the second metal strip through a first connection hole, the first connection hole at least penetrates through the passivation layer, the organic insulation layer and the gate insulation layer, the touch signal line is coupled to the first metal strip through a second connection hole, and the second connection hole at least penetrates through the passivation layer, the organic insulation layer and the gate insulation layer.

14. The array substrate according to claim 13, wherein the first connection hole comprises a first sub-hole and a second sub-hole, the first sub-hole penetrates through the passivation layer to expose a part of the touch electrode, the second sub-hole penetrates through the organic insulation layer and the gate insulation layer to exposes a part of the second metal strip, the array substrate further comprises a first connection pattern, and an orthogonal projection of the first connection pattern onto the base substrate covers an orthogonal projection of the first sub-hole onto the base substrate and an orthogonal projection of the second sub-hole onto the base substrate to enable the touch electrode to be coupled to the second metal strip.

15. The array substrate according to claim 14, wherein the first connection pattern is arranged at a same layer and made of a same material as the pixel electrode, wherein the second connection hole comprises a third sub-hole and a fourth sub-hole, the third sub-hole penetrates through the passivation layer to expose a part of the touch signal line, the fourth sub-hole penetrates through the organic insulation layer and the gate insulation layer to expose a part of the first metal strip, the array substrate further comprises a second connection pattern, and an orthogonal projection of the second connection pattern onto the base substrate covers an orthogonal projection of the third sub-hole of the second connection hole onto the base substrate and an orthogonal projection of the fourth sub-hole of the second connection hole onto the base substrate to enable the touch signal line to be coupled to the first metal strip.

16. The array substrate according to claim 1, wherein in two adjacent metal pattern units in the first direction, the first metal strip in one metal pattern unit and the second metal sub-line in the other metal pattern unit are arranged at two opposite sides of a same data line, and in a direction parallel to the base substrate and perpendicular to the second direction, a distance between a boundary of an orthogonal projection of the first metal strip onto the base substrate and a boundary of the orthogonal projection of the data line onto the base substrate is the same as a distance between a boundary of an orthogonal projection of the second metal sub-line onto the base substrate and the boundary of the orthogonal projection of the data line onto the base substrate.

17. The array substrate according to claim 13, further comprising a driving circuitry, wherein at least a part of an output electrode of the driving circuitry is arranged at a side of the organic insulation layer close to the base substrate, the pixel electrode is coupled to the output electrode through a third connection hole, and the third connection hole at least penetrates through the organic insulation layer and the passivation layer to expose the output electrode of the driving circuitry and enable the pixel electrode to be coupled to the output electrode, wherein the driving circuitry comprises a driving transistor, the third connection hole comprises a fifth sub-hole and a sixth sub-hole, the fifth sub-hole penetrates through the organic insulation layer, the sixth sub-hole penetrates through the passivation layer, an orthogonal projection of the fifth sub-hole onto the base substrate covers an orthogonal projection of the sixth sub-hole onto the base substrate, and the pixel electrode is coupled to the output electrode through the third connection hole.

18. The array substrate according to claim 10, wherein each pixel electrode comprises a plurality of slits extending in the second direction.

19. A display device, comprising the array substrate according to claim 1, a counter substrate arranged opposite to the array substrate, and a liquid crystal layer arranged between the array substrate and the counter substrate, wherein a black matrix is arranged on the counter substrate, an orthogonal projection of the black matrix onto the array substrate is within the light shielding region of the sub-pixel, in the direction parallel to the base substrate and perpendicular to the second direction, a distance between a boundary of an orthogonal projection of the black matrix onto the base substrate and the boundary of the orthogonal projection of the pixel electrode in one sub-pixel adjacent to the black matrix onto the base substrate is the same as a distance between the boundary of the orthogonal projection of the black matrix onto the base substrate and a boundary of the orthogonal projection the pixel electrode in the other sub-pixel adjacent to the black matrix onto the base substrate, and a distance between the boundary of the orthogonal projection of the black matrix onto the base substrate and the boundary of the orthogonal projection of the common electrode in one sub-pixel adjacent to the data line onto the base substrate is the same as a distance between the boundary of the orthogonal projection of the black matrix onto the base substrate and a boundary of an orthogonal projection the common electrode in the other sub-pixel adjacent to the black matrix onto the base substrate.

* * * * *